(12) United States Patent
Kim et al.

(10) Patent No.: US 8,435,380 B2
(45) Date of Patent: *May 7, 2013

(54) SUBSTRATE CHUCKING MEMBER, SUBSTRATE PROCESSING APPARATUS HAVING THE MEMBER, AND METHOD OF PROCESSING SUBSTRATE USING THE MEMBER

(75) Inventors: Bong Joo Kim, Cheonan-si (KR); Taek Youb Lee, Cheonan-si (KR)

(73) Assignee: Semes Co., Ltd., Chungcheongnam-Do (KR)

( * ) Notice: Subject to any disclaimer, the term of this patent is extended or adjusted under 35 U.S.C. 154(b) by 451 days.

This patent is subject to a terminal disclaimer.

(21) Appl. No.: 12/591,624

(22) Filed: Nov. 25, 2009

(65) Prior Publication Data
US 2010/0130020 A1    May 27, 2010

(30) Foreign Application Priority Data
Nov. 26, 2008   (KR) .................. 10-2008-0118260

(51) Int. Cl.
*H01L 21/465* (2006.01)
(52) U.S. Cl.
USPC ................. 156/345.55; 156/345.23; 134/157
(58) Field of Classification Search ............. 156/345.55, 156/345.23; 118/730; 134/157
See application file for complete search history.

(56) References Cited

U.S. PATENT DOCUMENTS

| | | | |
|---|---|---|---|
| 5,989,342 A * | 11/1999 | Ikeda et al. ............. | 118/52 |
| 7,866,058 B2 * | 1/2011 | Kim et al. ............. | 34/381 |
| 2008/0052948 A1 * | 3/2008 | Kim et al. ............. | 34/317 |
| 2008/0127888 A1 * | 6/2008 | Kim et al. ............. | 118/52 |
| 2010/0126539 A1 * | 5/2010 | Lee et al. ............. | 134/157 |

FOREIGN PATENT DOCUMENTS

| | | |
|---|---|---|
| JP | 10-135314 | 5/1998 |
| JP | 2001-015477 | 1/2001 |
| JP | 2001-250859 | 9/2001 |
| JP | 2006-120666 | 5/2006 |
| JP | 2008-135750 | 6/2008 |
| KR | 10-2008-0009586 | 1/2008 |

OTHER PUBLICATIONS

Machine Generated English Translation of JP 2001-250859 published Sep. 14, 2001.*

* cited by examiner

*Primary Examiner* — Sylvia R. MacArthur
(74) *Attorney, Agent, or Firm* — Harness, Dickey & Pierce, P.L.C.

(57) ABSTRACT

A substrate chucking member includes a substrate supporting member and a rotation adjustment unit. The supporting member includes a rotatable supporting plate to load a substrate, and chucking pins disposed at the supporting plate for spacing the substrate off the top of the supporting plate by supporting the edge of the substrate from a side of the substrate. Each of the chucking pins is rotatable for rotating the substrate supported on the chucking pins. The rotation adjustment unit is disposed under the supporting plate for adjusting rotation of the chucking pins. During a process, since a substrate is rotated by the chucking pins to vary points of the substrate making contact with the chucking pins, positions of the substrate where a process liquid falls after colliding with the chucking pins can be continuously varied. Therefore, the substrate can be processed without defects at an end part of the substrate.

16 Claims, 9 Drawing Sheets

SUBSTRATE CHUCKING MEMBER, SUBSTRATE PROCESSING APPARATUS HAVING THE MEMBER, AND METHOD OF PROCESSING SUBSTRATE USING THE MEMBER

CROSS-REFERENCE TO RELATED APPLICATIONS

This U.S. non-provisional patent application claims priority under 35 U.S.C. §119 of Korean Patent Application No. 10-2008-0118260, filed on Nov. 26, 2008, the entire contents of which are hereby incorporated by reference.

BACKGROUND OF THE INVENTION

The present invention disclosed herein relates to an apparatus for processing a semiconductor substrate, and more particularly, to a substrate chucking member for processing a semiconductor substrate using a process liquid, a substrate processing apparatus having the substrate chucking member, and a method of processing a substrate using the substrate chucking member.

Electronic devices such as semiconductor memory devices and a flat display device include a substrate. Such a substrate may be a silicon wafer or a glass substrate. A plurality of conductive-layer patterns are formed on the substrate and insulation-layer patterns are disposed between the conductive-layer patterns for insulating the conductive-layer patterns. The conductive-layer patterns or the insulation-layer patterns are formed through a series of processes such as exposing, developing, and etching processes.

Such processes include a process of removing impurity particles. If the impurity particles are contained on the surface of the substrate during process forming a pattern, the impurity particles will induce defects of the pattern. To prevent such problem, the impurity particle removing process is necessary. Impurities can be removed from the substrate by, for example, a chemical method or a physical method. In the chemical method, the surface of the substrate is processed by using a chemical. In the physical method, impurity particles adsorbed on the surface of the substrate are removed by applying a physical force.

When the substrate is cleaned with a chemical, although a chemical is injected toward the substrate, the chemical can fall back into the substrate after colliding with chucking pins used to support the lateral side of the substrate. Particularly, since the substrate is cleaned in a state where the substrate is fixed by the chucking pins, a chemical may fall only on certain positions after colliding with the chucking pins. Therefore, substrate cleaning errors may be caused.

SUMMARY OF THE INVENTION

The present invention provides a substrate chucking member configured to prevent substrate processing errors.

The present invention also provides a substrate processing apparatus including the substrate chucking member.

The present invention also provides a method of processing a substrate using the substrate chucking member.

Embodiments of the present invention provide substrate chucking members including a substrate supporting member and a rotation adjustment unit.

The substrate supporting member includes a rotatable supporting plate configured to load a substrate thereon, and a plurality of chucking pins disposed at the supporting plate for spacing a substrate loaded on the supporting plate off a top surface of the supporting plate by supporting an edge part of the substrate from a side of the substrate. Each of the chucking pins is rotatable for rotating the substrate supported on the chucking pins. The rotation adjustment unit is disposed under the supporting plate for adjusting rotation of the chucking pins.

In other embodiments of the present invention, devices/methods substrate processing apparatuses include a process vessel and a substrate chucking unit.

The process vessel is configured to process a substrate therein. The substrate chucking unit is disposed in the process vessel for supporting a substrate. The substrate chucking unit includes a substrate supporting member and a rotation adjustment unit. The substrate supporting member includes a rotatable supporting plate configured to load a substrate thereon, and a plurality of chucking pins disposed at the supporting plate for spacing a substrate loaded on the supporting plate off a top surface of the supporting plate by supporting an edge part of the substrate from a side of the substrate. Each of the chucking pins is rotatable for rotating the substrate supported on the chucking pins. The rotation adjustment unit is disposed under the supporting plate for adjusting rotation of the chucking pins.

In still other embodiments of the present invention, there are provided methods of processing a substrate. The methods are as follows. First, a substrate is placed at a supporting plate. The substrate is spaced off the supporting plate by supporting an edge part of the substrate from a side of the substrate by using a plurality of chucking pins disposed at the supporting plate. While rotating the substrate by rotating the supporting plate, a process liquid is injected onto the substrate so as to process the substrate, and together with this, the chucking pins are rotated on center axes thereof so as to vary points of the substrate that make contact with the chucking pins.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Hereinafter, it will be described about an exemplary embodiment of the present invention in conjunction with the accompanying drawings.

Figure 1:
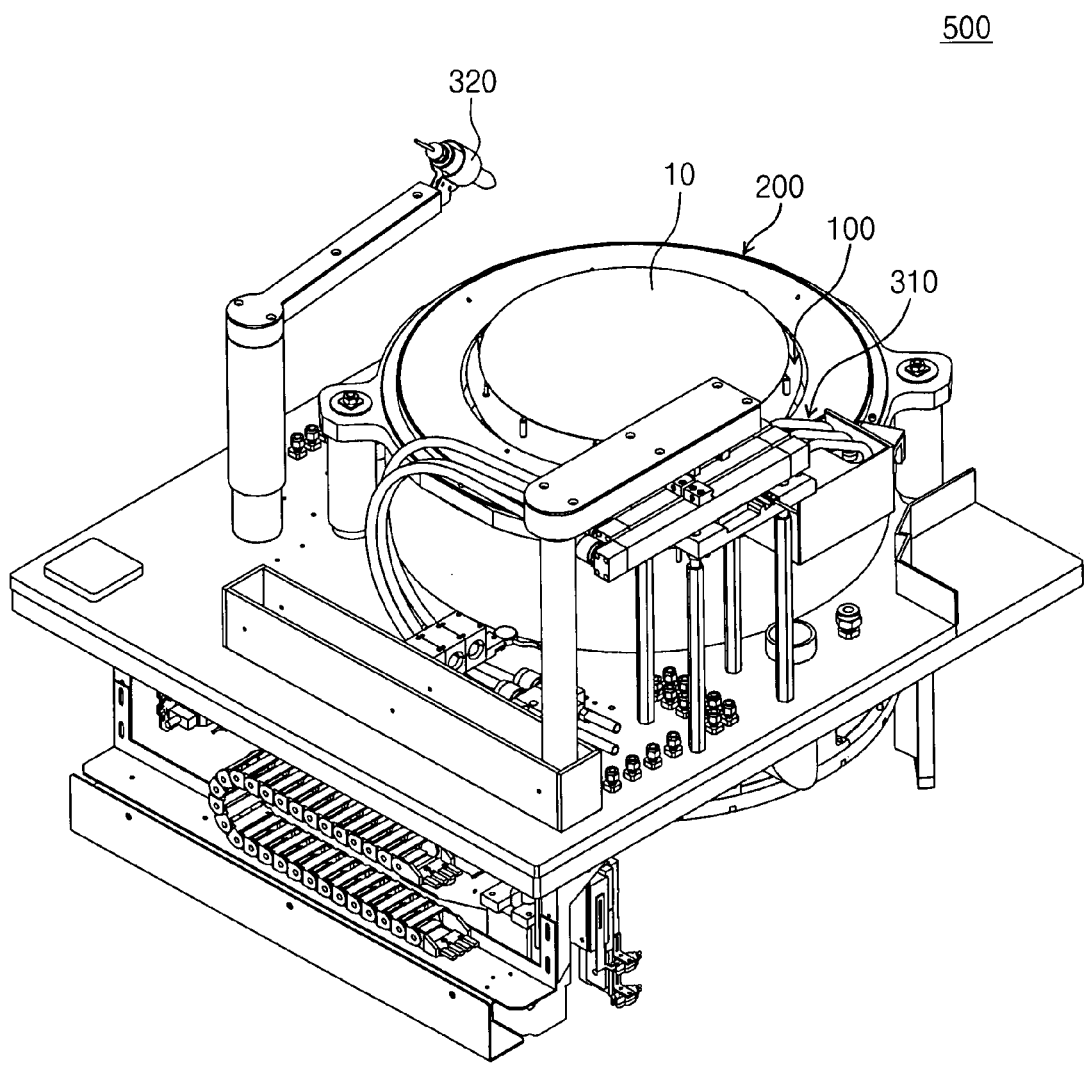
FIG. 1 is a perspective view illustrating a substrate processing apparatus according to an embodiment of the present invention.
Figure 2:
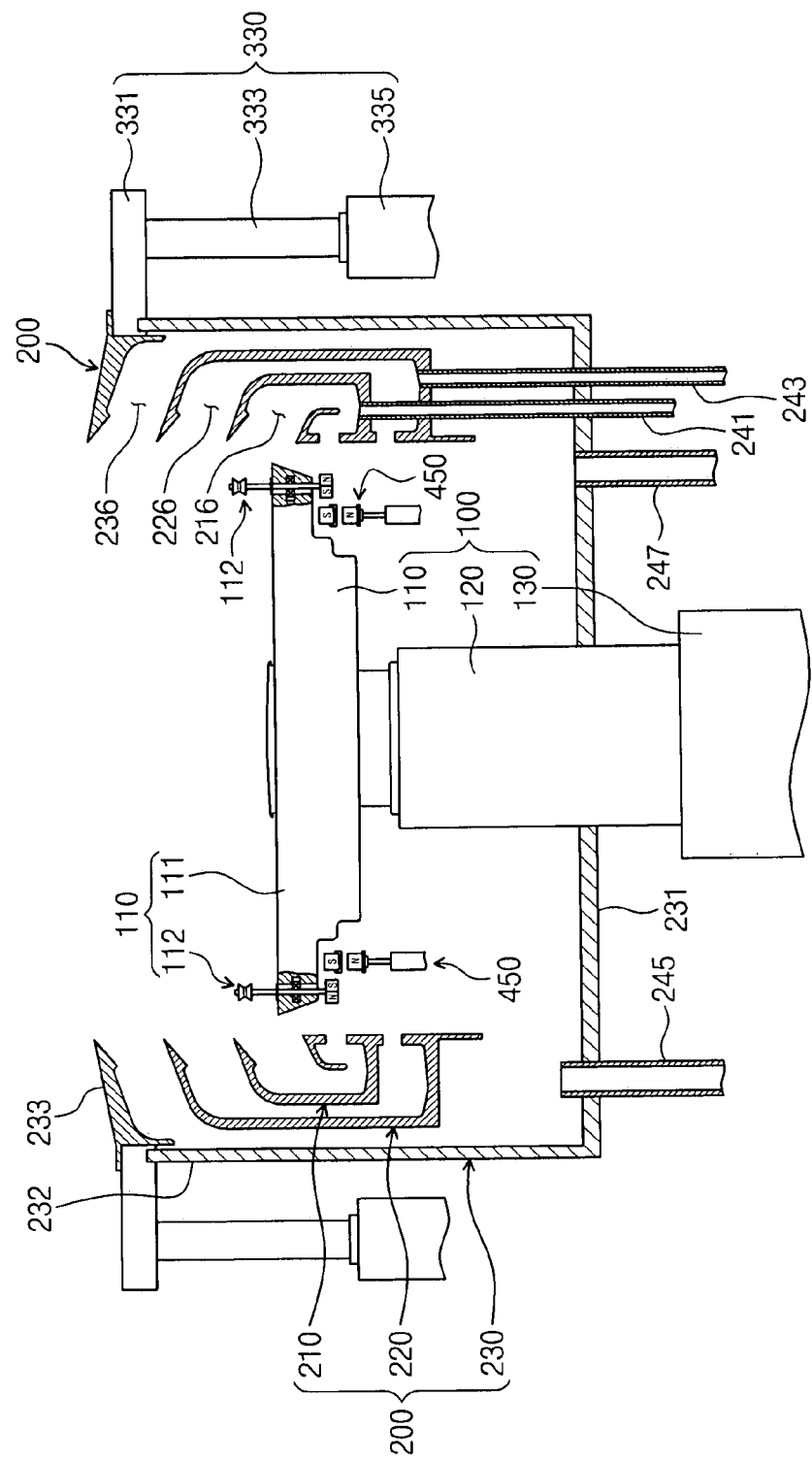
FIG. 2 is a partial vertical sectional view illustrating a process vessel and a substrate supporting member of FIG. 1.
Figure 3:
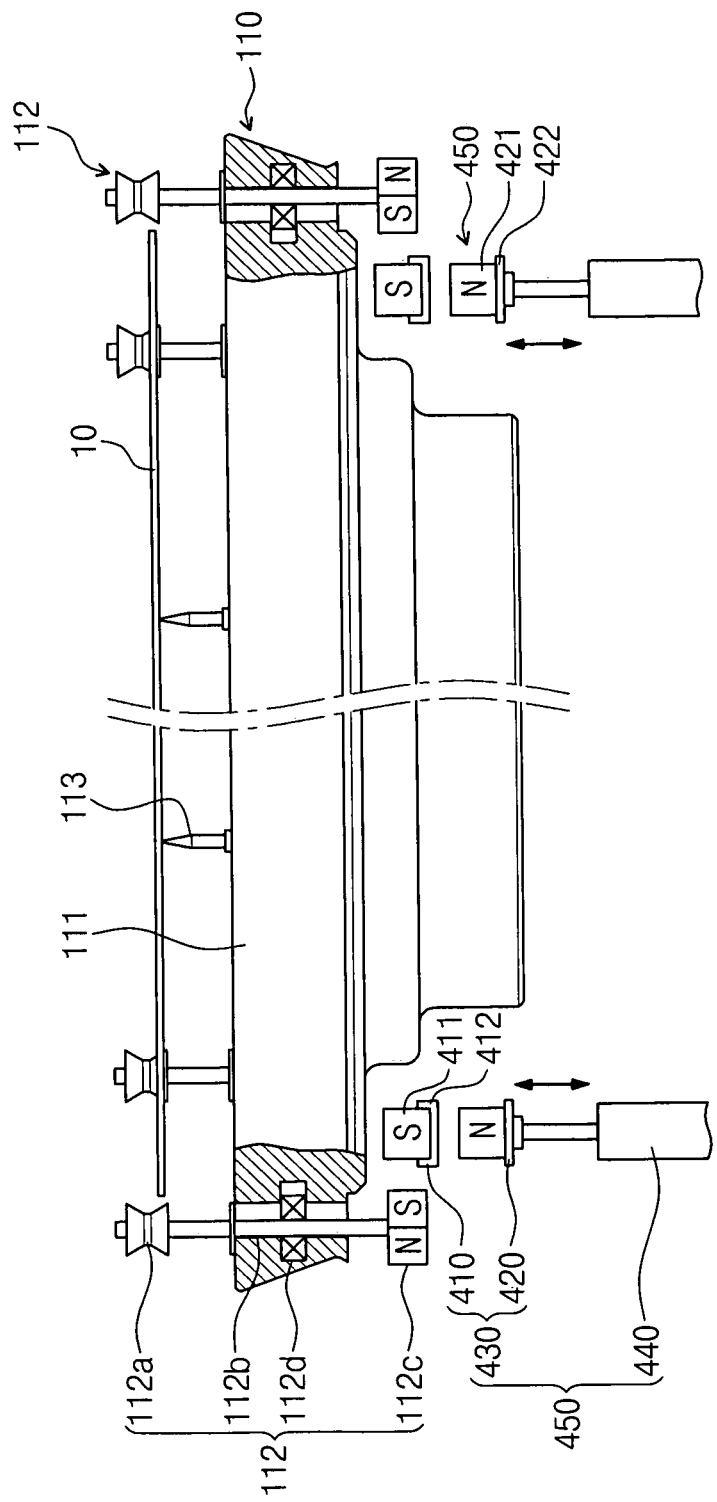
FIG. 3 is a view illustrating the substrate supporting member and a rotation adjustment unit of FIG. 2.

FIG. 1 is a perspective view illustrating a substrate processing apparatus according to an embodiment of the present invention, FIG. 2 is a vertical sectional view illustrating a process vessel and a substrate supporting member of FIG. 1; and FIG. 3 is a view illustrating the spin head 110 and the rotation adjustment unit 450 of FIG. 2.

Referring to FIGS. 1 and 2, a substrate processing apparatus 500 may include a substrate supporting member 100, a process vessel 200, a plurality of nozzles 310 and 320, an elevating unit 330, and a rotation adjustment unit 450.

The substrate supporting member 100 is disposed in the process vessel 200. The substrate supporting member 100 may include a spin head 110, a rotation shaft 120, and a rotation driving unit 130. The substrate supporting member 100 is used to fix a wafer 10 for processing a wafer 10.

In detail, the spin head 110 has substantially a disk shape. When the wafer 10 is process, the wafer 10 is placed on the spin head 110 and faces to the top surface of the spin head 110.

The rotation shaft 120 is coupled to the bottom side of the spin head 110. The rotation shaft 120 is also coupled to the rotation driving unit 130 so that the rotation shaft 120 can be rotated on its center axis by receiving rotation power from the rotation driving unit 130. The rotation power is transmitted from the rotation shaft 120 to the spin head 110 so that the spin head 110 can be rotated together with the wafer 10 fixed to the spin head 110.

With reference to the accompanying drawings, an explanation will now be given on the structure of the spin head 110.

Referring to FIGS. 2 and 3, the spin head 110 may include a supporting plate 111, a plurality of chucking pins 112, and a plurality of supporting pins 113.

In detail, a wafer 10 is loaded above the supporting plate 111, which is configured to be rotated by the rotation shaft 120 coupled to the bottom side of the spin head 110. The chucking pins 112 and the supporting pins 113 are disposed on the top surface of the supporting plate 111.

The supporting pins 113 supports the bottom surface of the wafer 10 loaded above the supporting plate 111 in a state where the wafer 10 is spaced apart from the top surface of the supporting plate 111. The chucking pins 112 are disposed around the supporting pins 113 so as to space the wafer 10 off the supporting pins 113 by supporting the lateral edge of the wafer 10 placed on the supporting pins 113.

Specifically, each of the chucking pins 112 may include a supporting part 112a, a rotation shaft 112b, and a pin rotation part 112c. The supporting part 112a is concaved at its longitudinal center, and during a process, the edge of the wafer 10 is placed on the concaved portion of the supporting part 112a.

The supporting part 112a is coupled to the upper end of the rotation shaft 112b. The rotation shaft 112b is inserted through the supporting plate 111 and configured to be rotated on its center axis. The pin rotation part 112c is coupled to the lower end of the rotation shaft 112b. The pin rotation part 112c has magnetism so that the pin rotation part 112c can be rotated by magnetic interaction with the rotation adjustment unit 450. A rotation force of the pin rotation part 112c is transmitted to the supporting part 112a through the rotation shaft 112b such that the supporting part 112a can be rotated.

The wafer 10 placed on the supporting part 112a is rotated as the supporting part 112a is rotated, and thus points of the wafer 10 making contact with the chucking pins 112 are varied. Owing to this structure, when a wafer 10 is processed by using the substrate processing apparatus 500, positions of the wafer 10, at which process liquid falls on the wafer 10 after the process liquid collides with the chucking pins 112, can be continuously varied, and thus generation of defects at the edge part of the wafer 10 can be prevented.

Figure 4:
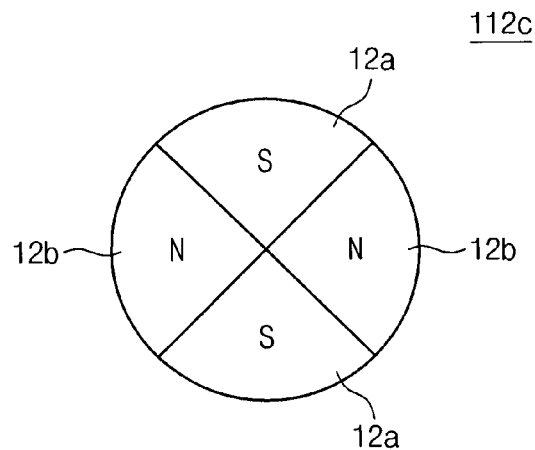
FIG. 4 is a rear plan view illustrating a pin rotation part of FIG. 3.

FIG. 4 is a rear plan view illustrating a pin rotation part of FIG. 3.

Referring to FIGS. 3 and 4, the pin rotation part 112c can be shaped like a disk and include first and second pin magnets 12a and 12b. Each of the first pin magnets 12a has a fan shape with N-polarity. Each of the second pin magnets 12b has a fan shape with S-polarity. The first and second pin magnets 12a and 12b are alternately arranged.

In an embodiment of the present invention, the chucking pins 112 can be horizontally moved in radial directions of the supporting plate 111. That is, when a wafer 10 is loaded above the supporting plate 111, the chucking pins 112 are moved toward the center of the supporting plate 111 for supporting the wafer 10, and when a process is completed, the chucking pins 112 are moved toward the edge of the supporting plate 111 to put the wafer 10 down on the supporting pins 113.

The rotation adjustment unit 450 is disposed at a side of the pin rotation part 112c. The rotation adjustment unit 450 is disposed under the supporting plate 111 to adjust rotation of the chucking pin 112.

In detail, the rotation adjustment unit 450 may include at least one magnetic unit 430 and a vertical actuation part 440. The magnetic unit 430 is disposed at a side of the pin rotation part 112c, and thus a magnetic force can be formed between the magnetic unit 430 and the pin rotation part 112c to adjust rotation of the pin rotation part 112c.

Figure 5:
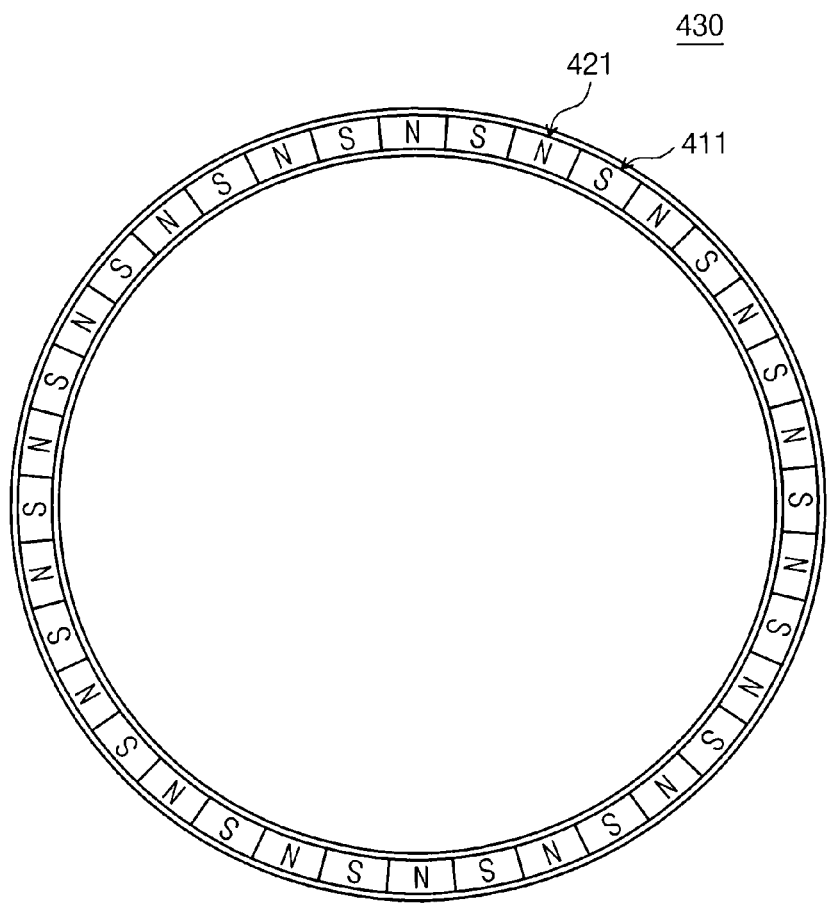
FIG. 5 is a plan view illustrating a magnetic unit of FIG. 3.
Figure 6:
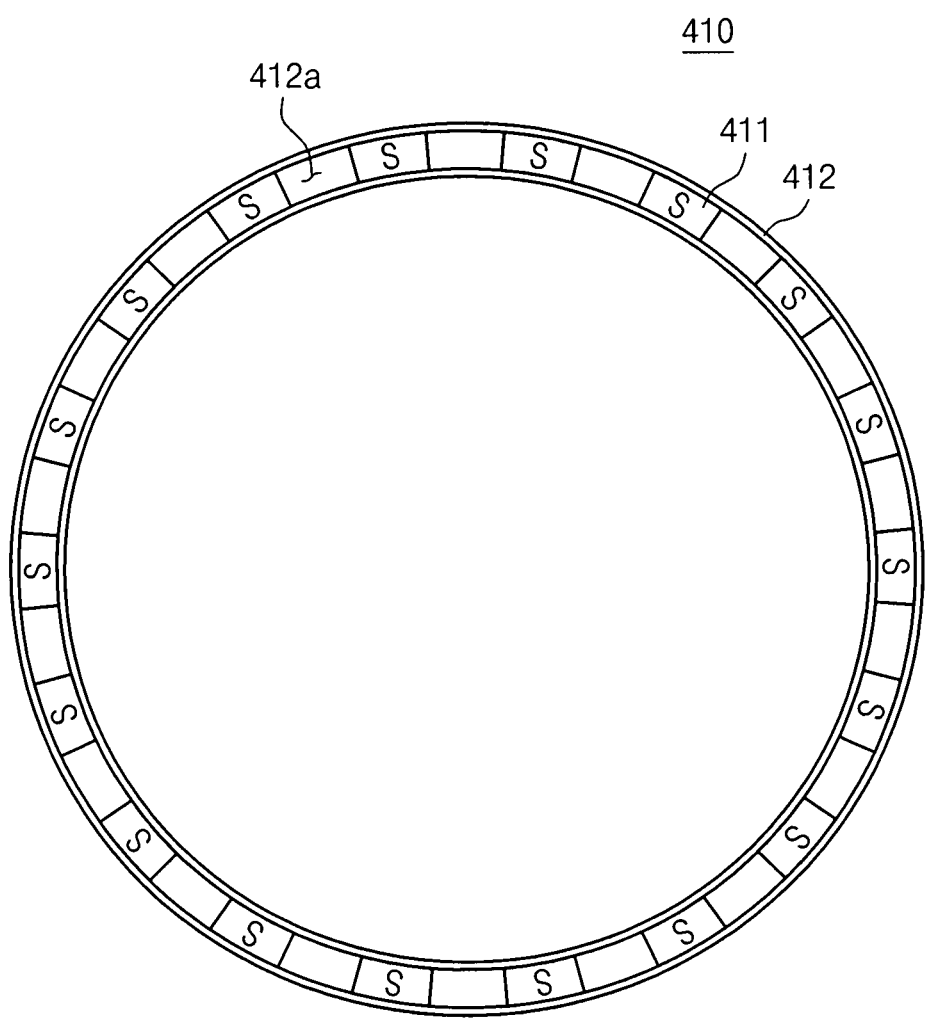
FIG. 6 is a plan view illustrating a first magnetic unit of FIG. 5.
Figure 7:
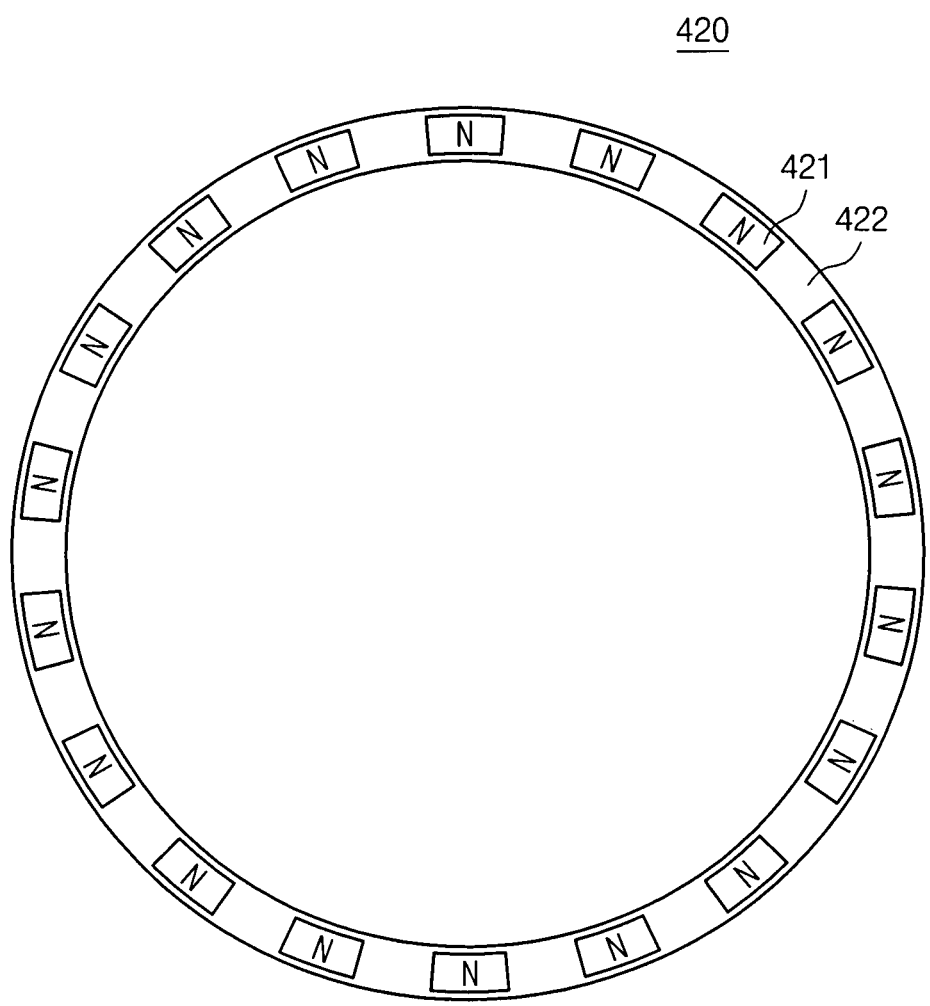
FIG. 7 is a plan view illustrating a second magnetic unit of FIG. 5.

FIG. 5 is a plan view illustrating a magnetic unit 430 of FIG. 3; FIG. 6 is a plan view illustrating a first magnetic unit of FIG. 5; and FIG. 7 is a plan view illustrating a second magnetic unit of FIG. 5.

Referring to FIGS. 3 and 5, the magnetic unit 430 is disposed at the bottom side of the supporting plate 111 and has a ring shape surrounding the supporting plate 111. The magnetic unit 430 may include first and second magnetic units 410 and 420 having different polarities.

Referring to FIGS. 3 and 6, the first magnet unit 410 may include a plurality of first magnets 411 and a first accommodation plate 412. The first magnets 411 are spaced apart from each other, and have S-polarity respectively. The first accommodation plate 412 has a ring shape, and the first magnets 411 are disposed on the top side of the first accommodation plate 412. The first magnets 411 are arranged according to the shape of the first accommodation plate 412. That is, the first magnets 411 are arranged in a ring shape.

A plurality of insertion holes 412a are formed in the first accommodation plate 412 so that the first accommodation plate 412 can couple with the second magnet unit 420. Each of the insertion holes 412a is disposed between two first magnets 411 adjacent to each other.

Referring to FIGS. 3 and 7, the second magnet unit 420 may be disposed under the first magnet unit 410. The second magnet unit 420 may include a plurality of second magnets 421 and a second accommodation plate 422. The second magnets 421 are spaced apart from each other, and have N-polarity respectively. The second accommodation plate 422 has a ring shape, and the second magnets 421 are disposed on the top side of the second accommodation plate 422. The second magnets 421 are arranged according to the shape of the second accommodation plate 422. That is, the second magnets 421 are arranged in a ring shape.

Referring again to FIGS. 3 and 5, the first magnets 411 and the second magnets 421 are alternately arranged when viewed from the top. In detail, the second accommodation plate 422 of the second magnet unit 420 may be coupled to the vertical actuation part 440 so as to be vertically moved. If the second magnet unit 420 is moved upward to the first magnet unit 410 by the vertical actuation part 440, the second magnets 421 are inserted into the insertion holes 412a of the first accommodation plate 412, respectively, and the second accommodation plate 422 is positioned at the bottom side of the first accommodation plate 412. Accordingly, each of the second magnets 421 is disposed between two first magnets 411 adjacent each other. In this way, the first magnets 411 and the second magnets 421 are arranged in contact with each other.

Since the first and second magnets 411 and 421 are alternately arranged, the pin rotation part 112c can be rotated by magnetic forces acting from the first and second magnets 411 and 421.

On the other hand, when the second accommodation plate 422 is moved downward to its original position by the vertical actuation part 440, only the first magnets 411 having S-polarity remain beside the pin rotation part 112c, and thus the pin rotation part 112c is not rotated due to an attractive force acting between the N-polarity second pin magnets 12b of the pin rotation part 112c and the first magnets 411.

In an embodiment of the present invention, the vertical actuation part 440 may be a cylinder actuator.

The substrate supporting member 100 may further include a back nozzle (not shown) to clean the backside of a wafer 10. The back nozzle may be disposed at the center of the top side of the spin head 110 to inject a cleaning fluid to a wafer 10.

Referring again to FIGS. 1 and 2, the substrate supporting member 100 and the rotation adjustment unit 450 are disposed inside the process vessel 200, and the process vessel 200 provides a space for processing a wafer.

Figure 8:
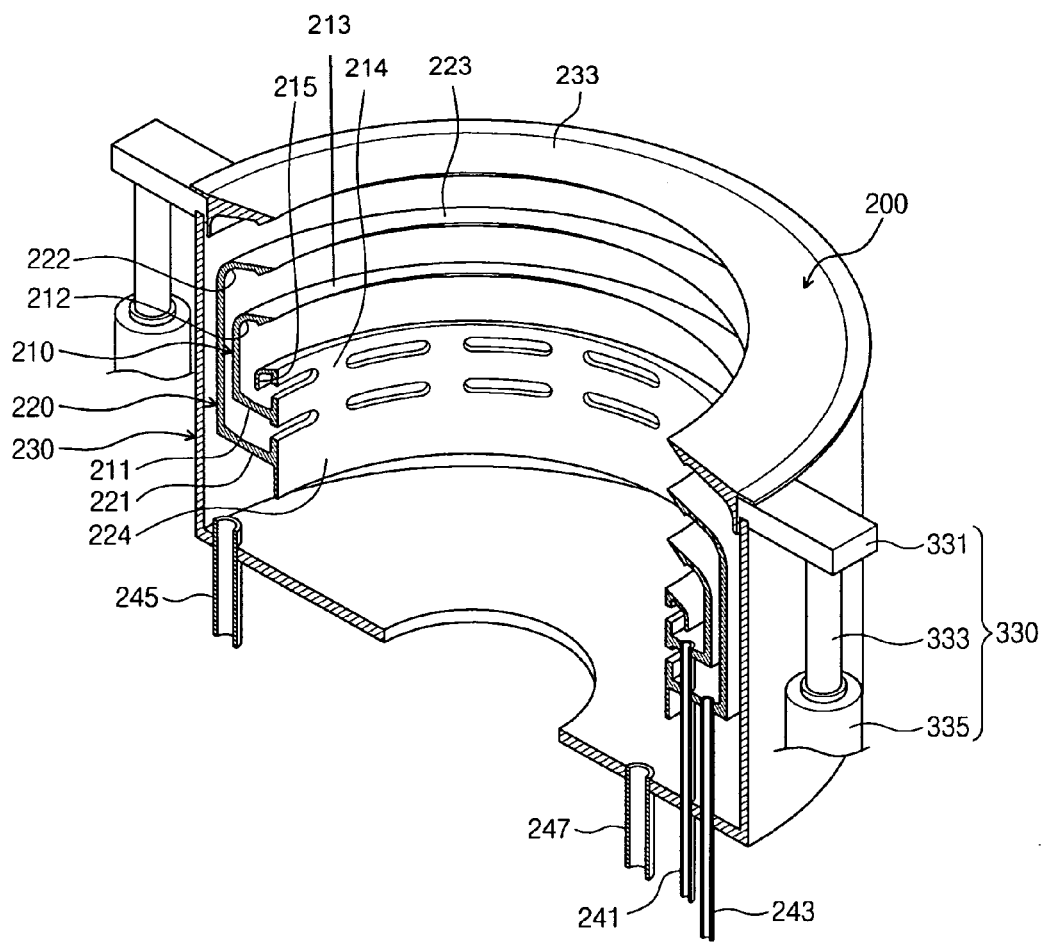
FIG. 8 is a cut-away view illustrating the process vessel of FIG. 2.

FIG. 8 is a cut-away view illustrating the process vessel 200 of FIG. 2.

Referring to FIGS. 2 and 8, the process vessel 200 surrounds the spin head 110 and provides a space for processing a wafer. The process vessel 200 has an opened top side, and the rotation shaft 120 of the substrate supporting member 100 is protruded to the outside of the process vessel 200 through an opening formed through the bottom side of the process vessel 200.

The process vessel 200 may include a first collecting vessel 210, a second collecting vessel 220, and a third collecting vessel 230. Chemicals used in a process can be separated and collected in the collecting vessels 210, 220, and 230 of the process vessel 200. That is, the collecting vessels 210, 220, and 230 may be used for collecting different chemicals used in a process. Thus, the chemicals can be reused.

In the current embodiment, the process vessel 200 includes three collecting vessels 210, 220, and 230. However, the number of the collecting vessels 210, 220, and 230 can be varied based on the process efficiency of the substrate processing apparatus 500.

In detail, the first collecting vessel 210 has a ring shape surrounding the spin head 110, the second collecting vessel 220 has a ring shape surrounding the first collecting vessel 210, and the third collecting vessel 230 has a ring shape surrounding the second collecting vessel 220.

The first collecting vessel 210 may include a bottom plate 211, a sidewall 212, a top plate 213, an inner wall 214, and a guide wall 215. Each of the bottom plate 211, the sidewall 212, the top plate 213, the inner wall 214, and the guide wall 215 has a ring shape. The top plate 213 is sloped upwardly from the sidewall 212, and the inner wall 214 faces the sidewall 212 and is connected to the guide wall 215. The guide wall 215 is spaced apart from the sidewall 212 and disposed inside the sidewall 212, and the guide wall 215 is sloped downward toward the bottom plate 211. The guide wall 215 and the top plate 213 are spaced from each other to form a first introduction opening 216, and a chemical is introduced into the first collecting vessel 210 through the first introduction opening 216.

The second collecting vessel 220 surrounds the first collecting vessel 210. The second collecting vessel 220 may include a bottom plate 221, a sidewall 222, a top plate 223, and an inner wall 224. Each of the bottom plate 221, the sidewall 222, the top plate 223, and the inner wall 214 has a ring shape. The bottom plate 221 of the second collecting vessel 220 is located under the bottom plate 211 of the first collecting vessel 210 to face the bottom plate 211. The sidewall 222 is spaced apart from the sidewall 212 of the first collecting vessel 210 and faces the sidewall 212. The top plate 223 is disposed above the top plate 213 of the first collecting vessel 210 and has the same shape as the top plate 213, and the top plate 223 is spaced apart from the top plate 213 of the first collecting vessel 210 to form a second introduction opening 226. A chemical is introduced into the second collecting vessel 220 through the second introduction opening 226. The inner wall 224 is lower than the first collecting vessel 210, and a part of the inner wall 224 protrudes downward more than the bottom plate 221.

The third collecting vessel 230 surrounds the second collecting vessel 220. The third collecting vessel 230 may include a bottom plate 231, a sidewall 232, and a top plate 233. Each of the bottom plate 231, the sidewall 232, and the top plate 233 has a ring shape. The bottom plate 231 of the third collecting vessel 230 faces the bottom plate 221 of the second collecting vessel 220 and is spaced downward from the bottom plate 221, and the rotation shaft 120 of the substrate supporting member 100 is inserted through the center part of the bottom plate 231. The sidewall 232 is spaced apart from the sidewall 222 of the second collecting vessel 220 to face the sidewall 222, and the top plate 233 is disposed above the top plate 223 of the second collecting vessel 220 and has the same shape as the top plate 223. The top plate 233 is spaced apart from the top plate 223 of the second collecting vessel 220 to form a third introduction opening 236, and a chemical is introduced into the third collecting vessel 230 through the third introduction opening 236.

The sizes of the first to third collecting vessels 210, 220, and 230 increase in the order of the first to third collecting vessels 210, 220, and 230.

When a process liquid is injected toward a wafer which is placed at the substrate supporting member 100 and is rotated, the process liquid is spread on the wafer toward the sidewalls 212, 222, and 232 of the collecting vessels 210, 220, and 230 due to centrifugal force, and is introduced into the collecting vessels 210, 220, and 230 through the introduction openings 216, 226, and 236.

In addition, collecting pipes 241, 243, 245, and 247 are connected to the bottom plates 211, 221, and 231 of the first to third collecting vessels 210, 220, and 230 so as to discharge process liquids collected in the first to third collecting vessels 210, 220, and 230 to an external recycling system (not shown). The collecting pipes 241 and 243 are connected to the first and second collecting vessels 210 and 220, respectively, and the collecting pipes 245 and 247 are connected to the third collecting vessel 230.

The elevating unit 330 is disposed at an outside of the process vessel 200 for vertical actuation. The elevating unit 330 is coupled to the sidewall 232 of the third collecting vessel 230 to adjust the vertical position of the process vessel 200. In detail, the elevating unit 330 may include a bracket 331, a movable shaft 333, and a driver 335. The bracket 331 is fixed to the sidewall 232 of the third collecting vessel 230 and is coupled to the movable shaft 333. The movable shaft 333 is connected to the driver 335 so as to be vertically moved by the driver 335.

When a wafer is placed at the spin head 110 or lifted from the spin head 110, the elevating unit 330 lowers the process vessel 200 so that the spin head 110 can be protruded from the top side of the process vessel 200. In addition, during a wafer processing process, the elevating unit 330 is used to raise or lower the process vessel 200 to adjust the vertical position of the spin head 110 relative to the collecting vessels 210, 220, and 230 so that process liquids supplied to a wafer can be separately collected in the collecting vessels 210, 220, and 230 according to the kinds of the process liquids.

In the substrate processing apparatus 500 of the current embodiment, the process vessel 200 is vertically moved to adjust the vertical position of the process vessel 200 relative to the spin head 110. However, alternatively, the vertical position of the process vessel 200 relative to the spin head 110 can be adjusted by vertically moving the spin head 110.

Referring again to FIG. 1, the nozzles 310 and 320 are disposed at the outside of the process vessel 200. The nozzles 310 and 320 are used to inject process liquids or gases to the center or edge part of a wafer fixed to the substrate supporting member 100 for cleaning or etching the wafer.

With reference to the accompanying drawings, an explanation will now be given on how a wafer 10 is rotated by the chucking pins 112 during a processing process.

Figure 9A:
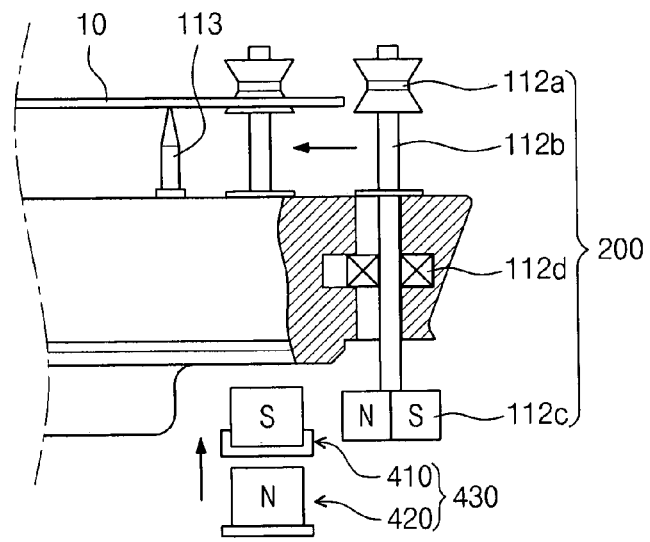
FIGS. 9A through 9C are views for explaining a process of cleaning a bevel of a wafer using the substrate processing apparatus illustrated in FIG. 2.
Figure 9B:
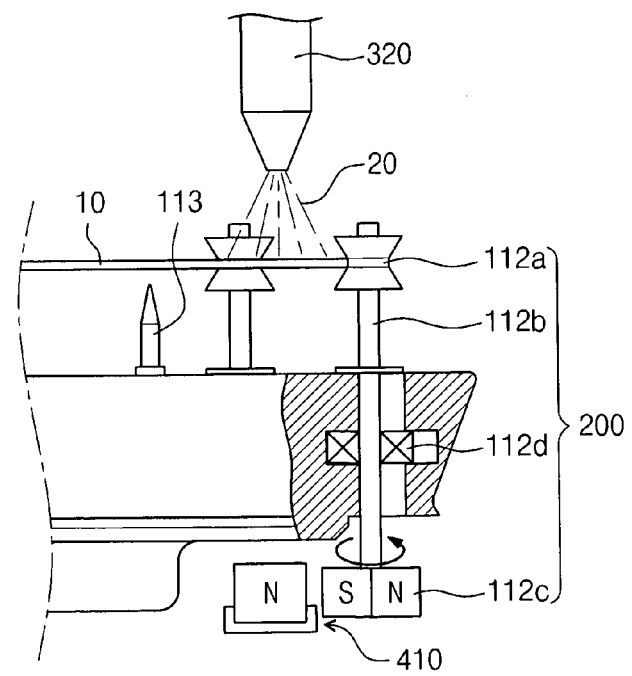
Figure 9C:
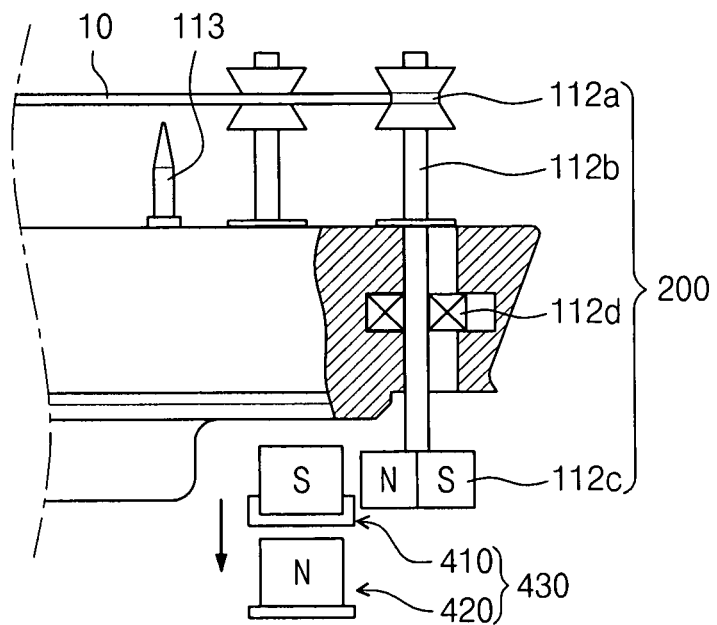

FIGS. 9A through 9C are views for explaining a process of cleaning the edge of a wafer using the substrate processing apparatus illustrated in FIG. 2.

Referring to FIGS. 9A through 9C, a wafer 10 is placed at the supporting plate 111, and the chucking pins 112 are moved toward the center of the supporting plate 111 for supporting the edge of the wafer 10.

Next, the nozzle 320 is moved above the wafer 10.

Next, while the wafer 10 is rotated by rotating the supporting plate 111, a process liquid is injected onto the wafer 10 through the nozzle 320. At the same time, the chucking pins 112 are rotated on their center axes so as to vary points of the wafer 10 that make contact with the chucking pins 112.

That is, the vertical actuation part 440 raises the second magnet unit 420 to insert the second magnets 421 into the insertion holes 412a of the first accommodation plate 412. Thus, each of the second magnets 421 is disposed between two first magnets 411 adjacent to each other. That is, since the first magnets 411 and the second magnets 421 are alternately arranged, the pin rotation part 112c can be rotated owing to magnetic forces exerted from the first and second magnets 411 and 421.

After the wafer 10 is processed by the process liquid, the vertical actuation part 440 lowers the second accommodation plate 422 to its original position. Then, only the first magnets 411 having S-polarity remain beside the pin rotation part 112c, and thus the pin rotation part 112c is stopped due to attractive forces acting between the first magnets 411 and the N-polarity second pin magnets 12a of the pin rotation part 112c.

After the rotation of the chucking pins 112c is stopped in this way, a drying fluid is injected onto the wafer 10 to dry the wafer 10.

According to the present invention, during a process, a substrate is rotated by the chucking pins so as to vary points of the substrate making contact with the chucking pins, and thus positions of the substrate on which a process liquid falls after the process liquid collides with the chucking pins can be continuously varied. Therefore, when a substrate is processed using the substrate processing apparatus, generation of defects can be prevented at an end part of the substrate.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate chucking unit comprising:
   a substrate supporting member including,
   a rotatable supporting plate configured to load a substrate thereon, and
   a plurality of chucking pins disposed at the supporting plate configured to space a substrate loaded on the supporting plate off a top surface of the supporting plate by supporting an edge part of the substrate from a side of the substrate, each of the chucking pins including magnetism at its lower end and configured to rotate the substrate; and
   a rotation adjustment unit disposed under the supporting plate for adjusting rotation of the chucking pins, the rotation adjustment unit including,
   at least one magnetic unit surrounding the supporting plate and adjacent to the magnetism, the at least one magnetic unit configured to adjust rotation of the pin rotation part by magnetic interaction with the magnetism; and
   a vertical actuation part configured to move the magnetic unit vertically,
   wherein the at least one magnetic unit includes a first magnetic unit having first polarity and a second magnetic unit having second polarity under the first magnetic unit, and the second magnetic unit is inserted into the first magnetic unit when the second magnetic unit is raised to the first magnetic unit by the vertical actuation part.

2. The substrate chucking unit of claim 1, wherein each of the chucking pins comprises:
   a rotation shaft disposed through the supporting plate and capable of rotating on a center axis thereof;
   a supporting part coupled to an upper end of the rotation shaft for supporting an edge part of a substrate loaded on the supporting plate, the supporting part configured to rotate the substrate by rotating the rotation shaft; and
   a pin rotation part disposed at a lower end of the rotation shaft, the pin rotation part having magnetism configured to be rotated and stopped by magnetic interaction with the rotation adjustment unit.

3. The substrate chucking unit of claim 1, wherein the rotation adjustment unit comprises:
   the at least one magnetic unit surrounding the supporting plate, the at least one magnetic unit disposed at a side of the pin rotation part and configured to adjust rotation of the pin rotation part by magnetic interaction with the pin rotation part; and
   a vertical actuation part configured to move the magnetic unit vertically.

4. The substrate chucking unit of claim 1, wherein the at least one magnetic unit comprises:
   the first magnetic unit comprising a plurality of first magnets which have the first polarity and are spaced apart from each other; and
   the second magnetic unit comprising a plurality of second magnets which have the second polarity opposite to the first polarity and are spaced apart from each other, the second magnetic unit being coupled to the vertical actuation part and configured to be vertically moved, wherein the first magnets are arranged in a ring shape, and the second magnets units are arranged in a ring shape.

5. The substrate chucking unit of claim 4, wherein the first and second magnets are alternately arranged when viewed from the top side thereof.

6. The substrate chucking unit of claim 5, wherein the second magnetic unit is disposed under the first magnetic unit, and each of the second magnets is inserted between two first magnets adjacent to each other of the first magnets when the second magnetic unit is raised to the first magnetic unit by the vertical actuation part.

7. The substrate chucking unit of claim 6, wherein the pin rotation part comprises:
at least two first pin magnets having the same polarity as the first polarity and shaped like a fan; and
at least two second pin magnets having the same polarity as the second polarity and shaped like a fan,
wherein the first and second pin magnets are alternately arranged.

8. The substrate chucking unit of claim 7, wherein the pin rotation part is shaped like a disk.

9. The substrate chucking unit of claim 1, wherein each of the chucking pins is adjustable in horizontal position with reference to the supporting plate.

10. A substrate processing apparatus comprising:
a process vessel configured to process a substrate therein; and
the substrate chucking unit of claim 1 disposed in the process vessel and configured to support a substrate.

11. The substrate processing apparatus of claim 10, wherein each of the chucking pins comprises:
a rotation shaft disposed through the supporting plate and capable of rotating on a center axis thereof;
a supporting part coupled to an upper end of the rotation shaft for supporting an edge part of a substrate loaded on the supporting plate, the supporting part configured to rotate the substrate by rotating the rotation shaft; and
a pin rotation part disposed at a lower end of the rotation shaft, the pin rotation part having magnetism configured to be rotated and stopped by magnetic interaction with the rotation adjustment unit.

12. The substrate processing apparatus of claim 10, wherein the rotation adjustment unit comprises:
the at least one magnetic unit surrounding the supporting plate, the at least one magnetic unit disposed at a side of the pin rotation part and configured to adjust rotation of the pin rotation part by magnetic interaction with the pin rotation part; and
a vertical actuation part configured to move the magnetic unit vertically.

13. The substrate processing apparatus of claim 10, wherein the at least one magnetic unit comprises:
the first magnetic unit comprising a plurality of first magnets which have the first polarity and are spaced apart from each other; and
the second magnetic unit comprising a plurality of second magnets which have the second polarity opposite to the first polarity and are spaced apart from each other, the second magnetic unit being coupled to the vertical actuation part and configured to be vertically moved,
wherein the first and second magnets are arranged in a ring shape, respectively, and the first and second magnets are alternately arranged when viewed from the top side thereof.

14. The substrate processing apparatus of claim 13, wherein the second magnetic unit is disposed under the first magnetic unit, and each of the second magnets is inserted between two first magnets adjacent to each other of the first magnets when the second magnetic unit is raised to the first magnetic unit by the vertical actuation part.

15. The substrate processing apparatus of claim 14, wherein the pin rotation part comprises:
at least two first pin magnets having the same polarity as the first polarity and shaped like a fan; and
at least two second pin magnets having the same polarity as the second polarity and shaped like a fan,
wherein the first and second pin magnets are alternately arranged.

16. The substrate processing apparatus of claim 10, further comprising a nozzle disposed above the supporting plate for injecting a process liquid toward an end part of a substrate placed at the supporting plate for processing the substrate.

* * * * *